US006242985B1

(12) United States Patent
Shinomiya

(10) Patent No.: US 6,242,985 B1
(45) Date of Patent: Jun. 5, 2001

(54) COMPOSITE TRANSISTOR DEVICE

(75) Inventor: Yoshitaka Shinomiya, Tokyo (JP)

(73) Assignee: Mobile Communications Tokyo Inc., Tokyo (JP)

( * ) Notice: Subject to any disclaimer, the term of this patent is extended or adjusted under 35 U.S.C. 154(b) by 0 days.

(21) Appl. No.: 09/439,962

(22) Filed: Nov. 12, 1999

(30) Foreign Application Priority Data

Aug. 30, 1999 (JP) .................................................. 11-243269

(51) Int. Cl.[7] .................................................. H03F 3/68
(52) U.S. Cl. .................................................. 330/295; 330/307
(58) Field of Search .................................................. 330/252, 295, 330/307, 286

(56) References Cited

U.S. PATENT DOCUMENTS

| 5,519,358 | * | 5/1996 | Tserng ................................ 330/307 |
| 5,561,397 | * | 10/1996 | Kumar et al. ........................ 330/295 |
| 5,955,926 | * | 9/1999 | Uda et al. ............................ 330/295 |
| 5,973,567 | * | 10/1999 | Heal et al. ........................... 330/286 |

* cited by examiner

Primary Examiner—Robert Pascal
Assistant Examiner—Henry Choe
(74) Attorney, Agent, or Firm—Frishauf, Holtz, Goodman, Langer & Chick, P.C.

(57) ABSTRACT

A semiconductor device for high-frequency power amplification includes a pair of first and second composite transistors each comprised of parallel-connected transistor cells each having parallel-connected transistor elements. The number of the transistor cells is selected to satisfy a requirement on the power capacity of the device. The two composite transistors form a power amplifier circuit for balanced-inputting and performing power amplification of a high-frequency signal. The transistor cells of the composite transistors are alternately formed on a semiconductor substrate on which electrode wiring patterns extending in the transistor-cell arraying direction are formed. Respective electrodes of transistor elements are collectively connected, composite-transistor by composite-transistor, to these patterns.

24 Claims, 6 Drawing Sheets

COMPOSITE TRANSISTOR DEVICE

BACKGROUND OF THE INVENTION

1. Technical Field

The present invention relates to a semiconductor device for a high-frequency power amplifier, and more particularly, to a semiconductor device which forms a high-frequency power amplifier accommodated in a transmitter of a mobile communication equipment such as a portable telephone.

2. Related Art

A mobile communication system has been widely utilized for radio-frequency communication between a number of pieces of mobile communication equipment and base stations located at distance in a service area. Such communication system is realized as a portable telephone or the like. A typical portable telephone comprises a transmitter section including a sonic-electric converter, modulator, frequency converter, and radio-frequency (RF) power amplifier.

The high-frequency (RF) power amplifier of a transmitter section of a portable telephone is required to carry out high-quality power-amplification of digitally modulated high-frequency signals of 2 GHz band. Most of conventional high-frequency power amplifiers are formed by single-ended circuits which have a proven track record in hybrid ICs. Recently, various attempts have been made to configure a high-frequency power amplifier by a balanced amplifier circuit such as a differential amplifier circuit comprised of a pair of high-frequency transistors of a common emitter type.

As schematically shown in FIG. 1, a high-frequency power amplifier 200 of transmitter section of a portable telephone is configured to amplify a high-frequency signal Sp, Sn which is balanced-input through bases of a pair of high-frequency transistors 1 and 2, and output the amplified high-frequency signal to inductive load 4 and 5 connected to collectors of these transistors 1 and 2. A transistor 3 connected to emitters of the transistors 1 and 2 serves as a constant current source for determining the bias current for these transistors.

As shown in FIG. 2, each of the transistors 1, 2 and 3 is formed in actual by a transistor cell 12 comprised of parallel-connected high-frequency transistors (hereinafter referred to as transistor elements) 11 each having a desire high-frequency characteristic. More specifically, the transistor elements 11 forming each transistor cell 12 are formed in array on a semiconductor substrate. For instance, each transistor element has a device configuration (not shown) having emitter and collector regions between which a base region is provided. The transistor elements 11 have their emitter electrodes E, base electrodes B and collector electrodes C which are formed as exemplarily shown in FIG. 3 and connected to electrode wiring patterns 13, 14 and 15, respectively. Ordinarily, each transistor cell 12 composed of transistor elements 11 serves as a single transistor having a desired high-frequency characteristic and a required current capacity (rated current).

In the case of a high-frequency power amplifier for use in a portable telephone, each of the transistors 1, 2 and 3 is formed by a group of transistors (hereinafter referred to as a composite transistor) 16 so as to attain a power handling capacity (rated power) corresponding to a maximum transmitting power output, each composite transistor 16 being composed of a required number of parallel-connected transistor cells 12, as exemplarily shown in FIG. 4. A high-frequency signal is power-amplified by the transistors 1 and 2, and the bias current level for the transistors 1, 2 is adjusted by the transistor 3.

The high-frequency power amplifier having the transistors 1 and 2 composed of the composite transistors 16 may produce a low-quality power-amplified high-frequency signal, due to the difference between operation characteristics of the two composite transistors 16. Even if the two groups of the transistor cells forming the two composite transistors 16 are formed monolithically on the semiconductor substrate with the intention of equalizing their operation characteristics, the operation characteristics may vary, in a strict sense, among individual transistor cells 12 due to the differences between positions on the substrate where these transistor cells 12 are formed. In the power amplifier shown in FIG. 4, one group of transistor cells 12 forming one composite transistor 16 serving as the transistor 1 are formed on one end of the semiconductor substrate, whereas another group of transistor cells 12 forming another composite transistor 16 serving as the transistor 2 are formed on another end of the substrate. Due to such a positional difference between these two transistor cell groups, a certain difference appears between their operation characteristics, resulting in low-quality power amplification of a high-frequency signal.

It is preferable for the power-amplified high-frequency signal to satisfy such a requirement on the balance characteristic that "high-frequency signal currents appearing at two output lines of a power amplifier be the same in magnitude and opposite in phase." Depending on a layout of electrode wiring patterns through which associated electrodes of the transistor cells 12 are connected, the power-amplified high-frequency signal can have unsatisfactory balance characteristic.

SUMMARY OF THE INVENTION

An object of the present invention is to provide a semiconductor device suited to configure a power amplifier for performing stable, high-quality power amplification of a high-frequency signal, while guaranteeing the balance characteristic of the high-frequency signal.

According to the present invention, there is provided a semiconductor device for a high-frequency power amplification. This semiconductor device comprises: a first composite transistor comprised of parallel-connected first transistor cells comprised of parallel-connected transistor elements; a second composite transistor comprised of parallel-connected second transistor cells comprised of parallel-connected transistor elements; first and second input wiring patterns connected to input ends of said first and second composite transistors, respectively; first and second output wiring patterns connected to output ends of said first and second composite transistors, respectively; and a semiconductor substrate formed with said first and second composite transistors, said first and second input wiring patterns, and said first and second output wiring patterns. The first and second transistor cells are alternately arranged one another to form a transistor cell array in which adjacent ones of the first and second transistor cells are close to each other. The first and second input wiring patterns and said first and second output wiring patterns extend in an arraying direction of the first and second transistor cells in the transistor cell array. The first and second composite transistors operate to balanced-input a high-frequency signal through said first and second input wiring patterns, perform power-amplification of the high-frequency signal, and output the power-amplified high-frequency signal from said first and second output wiring patterns.

In the semiconductor device of this invention, the power handling capacity of each composite transistor can be appropriately determined by selecting the number of the transistor cells forming the composite transistor and/or the number of transistor elements forming each transistor cell. Thus, the present invention can provide various types of power amplifier including a power amplifier for a transmitter section of a portable telephone required to produce a relatively large maximum transmitting output. In addition, the power amplifier of this invention is capable of performing stable, high-quality power amplification of high-frequency signals.

In the semiconductor device of this invention, the first and second transistor cells are alternately arranged, whereby transistor-cell pairs are formed. The first and second transistor cells forming each transistor-cell pair are formed in the semiconductor substrate so as to be adjacent to and close to each other, whereby the operation characteristics of these two transistor cells are equalized satisfactorily. Thus, the first and second composite transistors are equalized in their operation characteristics. In addition, the input and output wiring patterns, utilized for high-frequency signal input and output to and from the composite transistors, extend in parallel to the direction of arraying the transistor cells. Together with the feature regarding the transistor cell array, the just-mentioned structural feature regarding the wiring patterns makes it easy to equalize the lengths of high-frequency signal propagation paths for the respective transistor cells, whereby the balance characteristic of the power-amplified high-frequency signal can be improved.

In the present invention, preferably, the first and second transistor cells are identical in number of the transistor elements and in technical specification thereof. In this case, the operation characteristics of the first and second composite transistors are equalized. Each composite transistor comprised of a large number of transistor elements having the same technical specification is suited to be fabricated in the form of a monolithic integrated circuit.

Preferably, the transistor elements forming each of the first and second transistor cells are arrayed in a direction extending perpendicularly to the arraying direction of the transistor cells in the transistor cell array. In this case, a large number of transistor elements forming each composite transistor are appropriately arrayed in a two-dimensional matrix, whereby the composite transistor can be easily fabricated in the form of integrated circuit.

Preferably, the semiconductor device further includes input electrode terminals through which the high-frequency signal is inputted and which are formed in said semiconductor substrate at one end of the transistor cell array as viewed in the arraying direction of the transistor cells, and output electrode terminals through which the power-amplified high-frequency signal is outputted and which are formed in said semiconductor substrate at another end of the transistor cell array. The first and second input wiring patterns are connected to the input electrode terminals, and the first and second output wiring patterns are connected to the output electrode terminals.

In the just-mentioned preferred device, the input and output electrode terminals are disposed on the opposite ends of the transistor cell array. Together with the basic feature of the present invention having the input and output wiring patterns extending along the transistor-cell arraying direction, the preferred feature regarding the terminal arrangement makes it easy to equalize the lengths of high-frequency signal propagation paths extending from the input electrode terminals to the output electrode terminals via the transistor cells. If the signal propagation paths have the same length, required signal-propagation times are equalized, contributing to an improvement in the balance characteristic of the high-frequency signal.

Preferably, the semiconductor device of this invention further includes at least first, second, and third electrode wiring patterns formed in the semiconductor substrate, and a common wiring pattern formed in the semiconductor substrate and extending in the arraying direction of the transistor cells in the transistor cell array. Each of the first and second transistor elements has first, second, and third electrodes formed in the semiconductor substrate and respectively connected to the first, second, and third electrode wiring patterns. The first electrode wiring pattern is connected to the first and second input wiring patterns. The second electrode wiring pattern is connected to the common wiring pattern, and the third electrode wiring pattern is connected to the first and second output wiring patterns.

In the just-mentioned preferred device, the respective electrodes of the transistor elements forming the transistor cells of the first or second composite transistor are each connected to the input or output wiring pattern through a corresponding one of the electrode wiring patterns, or are grounded through the common wiring pattern or through the common wiring pattern and a third composite transistor, interposed between the common wiring pattern and the earth ground. Preferably, the third composite transistor adjusts the level of a bias current applied to the first and second electrode wiring patterns. The just-mentioned structural feature makes it possible to properly conduct the high-frequency signal inputting and outputting to and from these transistor cells, and permit the composite transistors to be fabricated in the form of integrated circuit with ease.

More preferably, the first and second transistor cells disposed adjacent to each other in the transistor cell array form a pair of transistor cells having their device constructions symmetric with respect to an imaginary boundary plane extending therebetween. In this case, those sections of respective electrode wiring patterns, through which the respective electrodes of the transistor elements of each transistor-cell pair are connected to the input or output wiring pattern, are equalized in their lengths. Alternatively, most portions of these electrode-wiring-pattern sections may be formed by a single common electrode line. This feature contributes to an improvement in the balance characteristic of high-frequency signal.

More preferably, each pair of transistor cells are comprised of pairs of transistor elements having their device constructions symmetric with respect to an imaginary boundary plane extending therebetween. Each pair of the transistor elements have their second electrodes which are disposed to be close to each other. In this case, most portions of those sections of the second electrode wiring pattern through which the second electrodes of each transistor-element pair are connected to the common wiring pattern may be formed by a single common electrode line. Moreover, the lengths of the remaining portions, on the second-electrode end, of the second-electrode-wiring-pattern sections are equalized and minimized, so that these remaining portions may be substantially eliminated. In this case, the output currents flowing from the second electrodes of each transistor-element pair into the second electrode wiring pattern are canceled out, thereby contributing to an improvement in the balance characteristic of high-frequency signal.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION

In the following, a semiconductor device for high-frequency power amplification according to an embodiment of the present invention will be explained.

Figure 1:
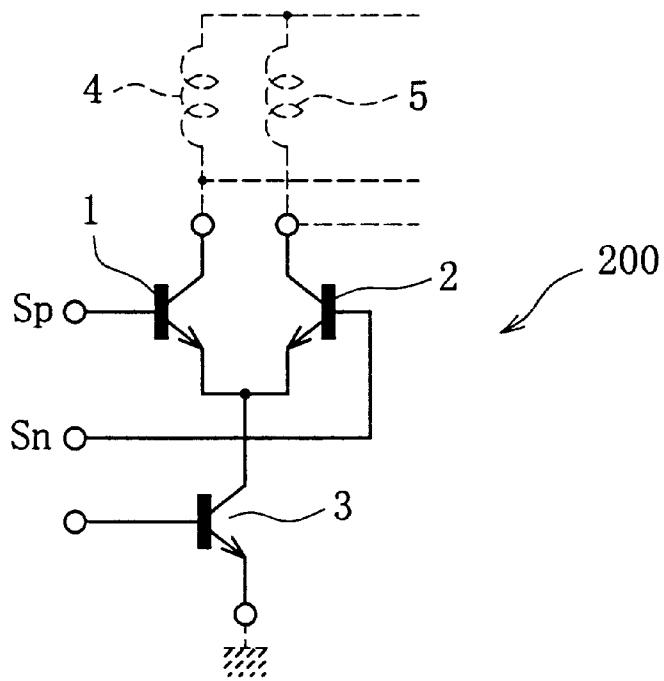
FIG. 1 is a circuit diagram showing the basic construction of a high-frequency power amplifier circuit.
Figure 2:
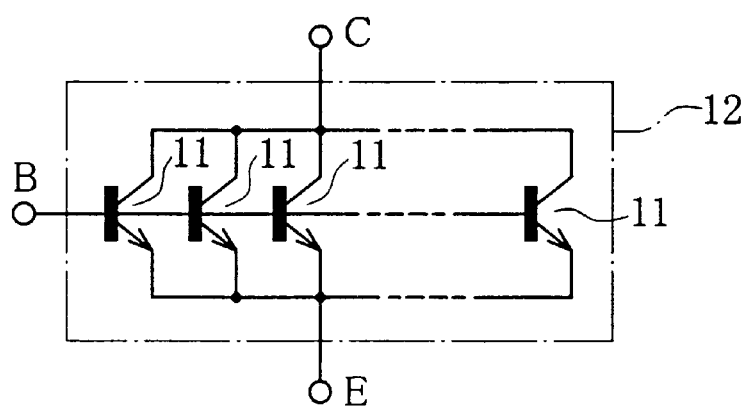
FIG. 2 is a view showing a transistor cell comprised of parallel-connected high-frequency transistor elements.
Figure 3:
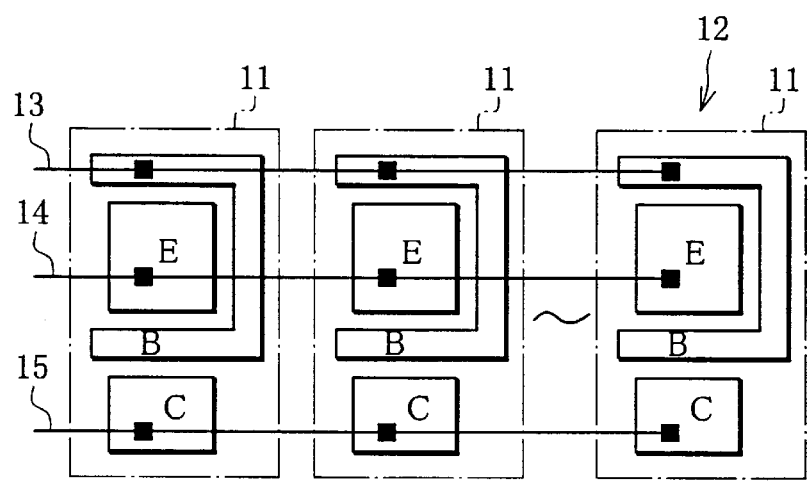
FIG. 3 is a view showing an electrode array and electrode wiring patterns in the transistor cell shown in FIG. 2.
Figure 4:
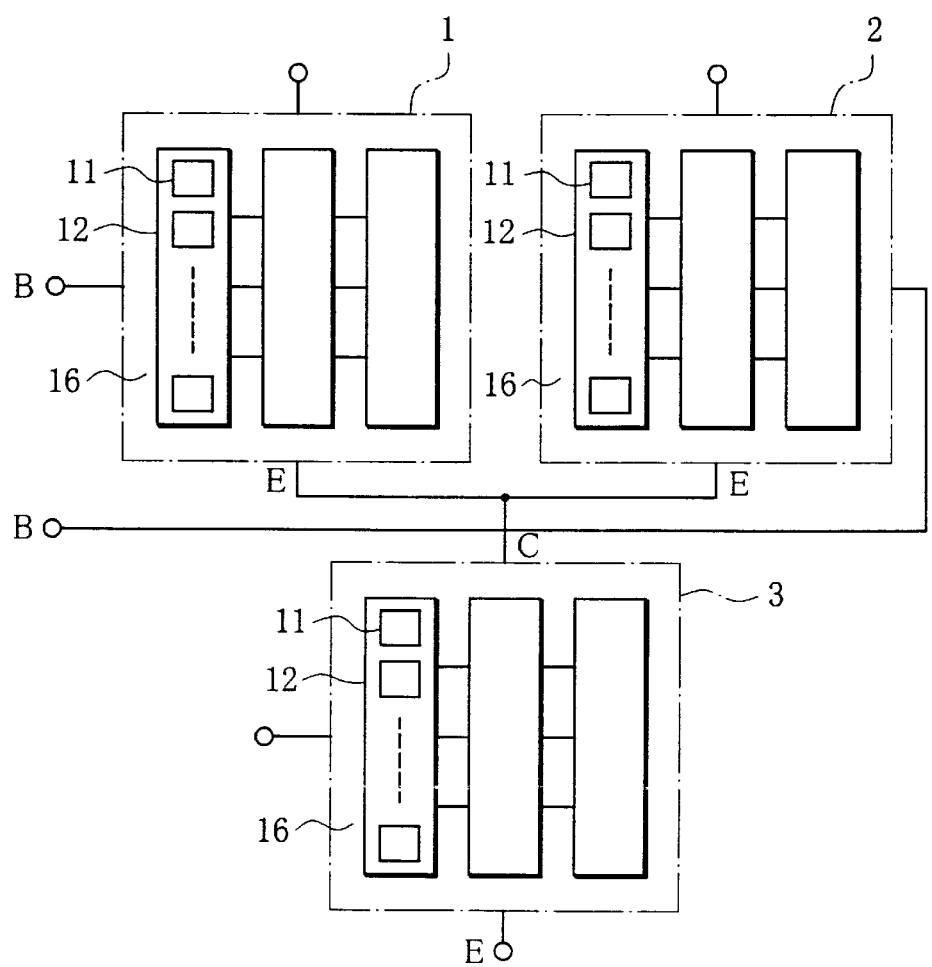
FIG. 4 is a view showing composite transistors arrayed on a semiconductor substrate of a semiconductor device for high-frequency power amplification.

The semiconductor device of this embodiment serving as a balanced power-amplifying circuit and especially serving as a differential amplifier of a type exemplarily shown in FIG. 4 for balanced-inputting a high-frequency signal and for performing power amplification of the same. For instance, this semiconductor device is used to constitute a power amplifier of a mobile communication equipment such as a portable telephone described in pending U.S. Ser. No. 09/203,642 filed on Dec. 1, 1998 and assigned to the same assignee as that of this application.

Figure 5:
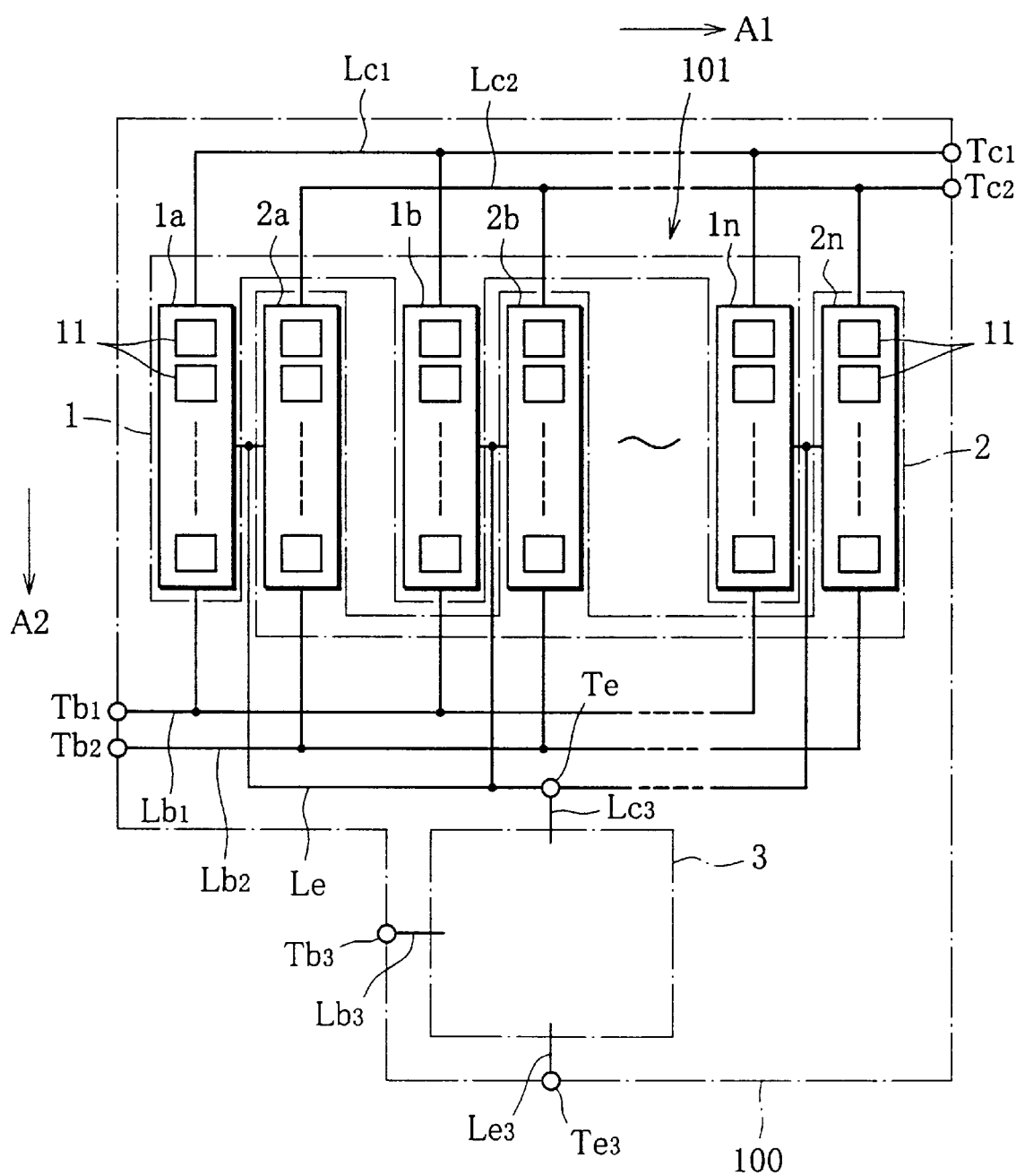
FIG. 5 is a view showing a semiconductor device for high-frequency power amplification according to an embodiment of the present invention, and showing a transistor cell array formed on a semiconductor substrate of the device.

As shown in FIG. 5, the semiconductor device is mainly comprised of three transistor groups (hereinafter referred to as composite transistors) 1, 2 and 3.

The first composite transistor 1 is comprised of parallel-connected first transistor cells $1j$ (j=a, . . . , n) each comprised of parallel-connected transistor elements 11. Preferably, the same number of transistor elements 11 which are identical in their technical specifications, especially, in high-frequency amplification characteristics, are utilized to constitute each first transistor cell $1j$.

Similarly, the second composite transistor 2 is comprised of parallel-connected second transistor cells $2j$ (j=a, . . . , n) each comprised of parallel-connected transistor elements 11. The number and technical specifications of the transistor elements 11 forming each second transistor cell $2j$ are the same as those of the transistor elements 11 forming each first transistor cell $1j$.

The first and second transistor cells $1j$ and $2j$ are alternately arranged to form a transistor cell array 101. Adjacent ones $1a$, $2a$; $1b$, $2b$; . . . , $1n$, $2n$ of the first and second transistor cells in the transistor cell array, as viewed in the arraying direction (shown by arrow As in FIG. 5) of the transistor cells, are disposed to be close to each other.

The transistor elements 11 forming each transistor cell are arrayed in the direction perpendicular to the arraying direction A1 of transistor cells. This arraying direction of the transistor elements is shown by arrow A2 in FIG. 5. Thus, a large number of transistor elements 11 constituting the first and second composite transistors 1 and 2 are arranged in a two-dimensional matrix on the substrate 100.

Figure 6:
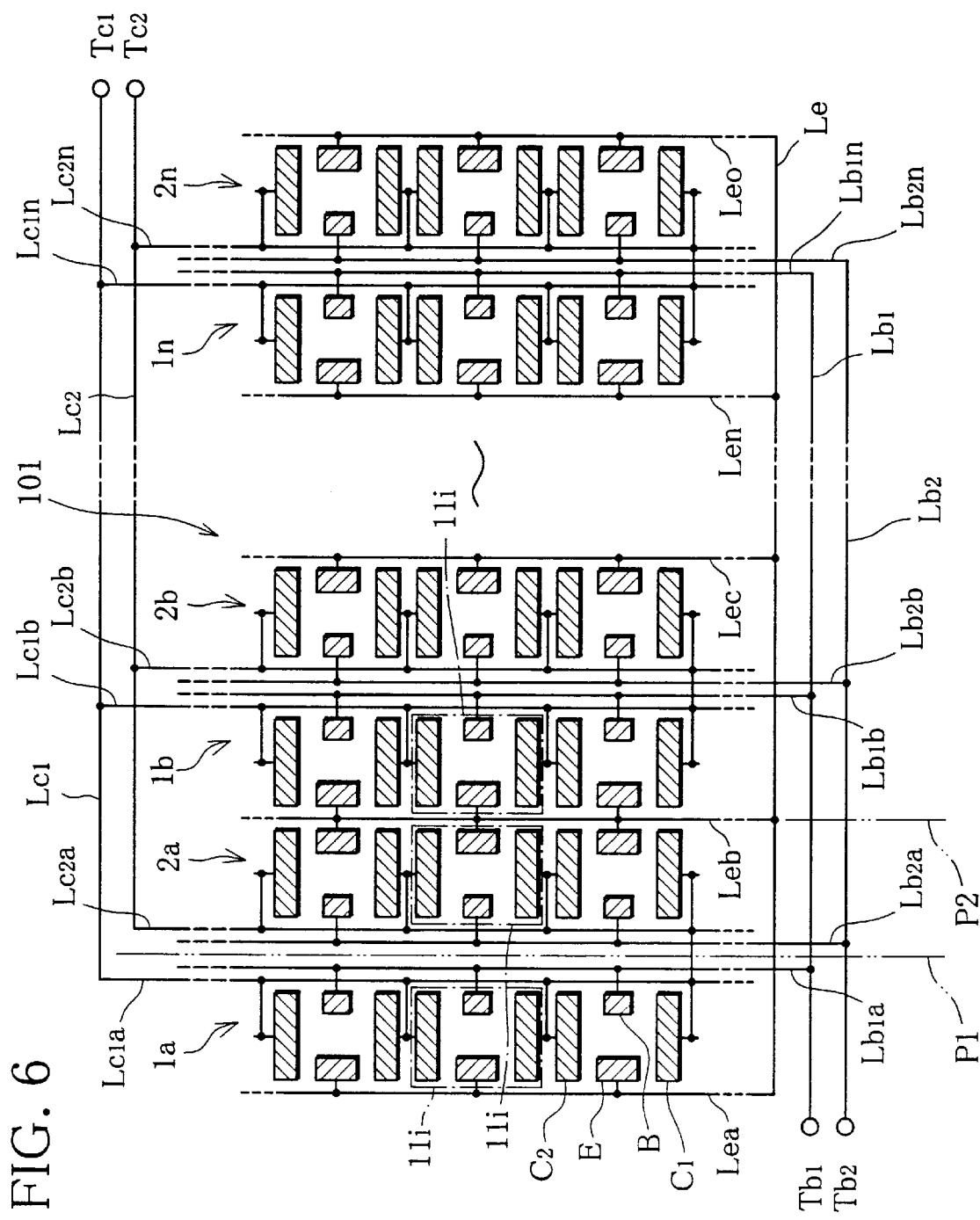
FIG. 6 is a view showing the arrangement of electrodes of transistor elements and electrode wiring patterns in the transistor cell array shown in FIG. 5.

In the transistor cell array shown in FIGS. 5 and 6, each of the first transistor cell $1a$, $1b$, . . . , or $1n$ and the second transistor cell $2a$, $2b$, . . . , or $2n$ adjacent, on the right side, to the first transistor cell form pairs of transistor elements 11 or 11$i$ (i=1, 2, . . . , N). As will be apparent from the positional arrangement of electrodes and wiring patterns illustrated in FIG. 6 and explained hereinafter, each transistor-element pair and each transistor-cell pair have their device constructions which are symmetric with respect to an imaginary boundary plane P1 extending between these two transistor elements or transistor cells in the arraying direction A2 of transistor elements.

Considering a major array portion obtained by removing the leftmost first transistor cell $1a$ and the rightmost second transistor cell $2n$ from the transistor cell array 101, each of the first transistor cell $1b$, $1c$ (not shown), . . . , or in and the second transistor cell $2a$, $2b$, . . . , or $2m$ (not shown) adjacent, on the left side, to the first transistor cell form pairs of transistor elements 11$i$ (i=1, 2, . . . , N). Each transistor-element pair and each transistor-cell pair have their device constructions which are symmetric with respect to an imaginary boundary plane P2 and in which their second electrodes E (mentioned later) are disposed to be close to each other.

Figure 9:
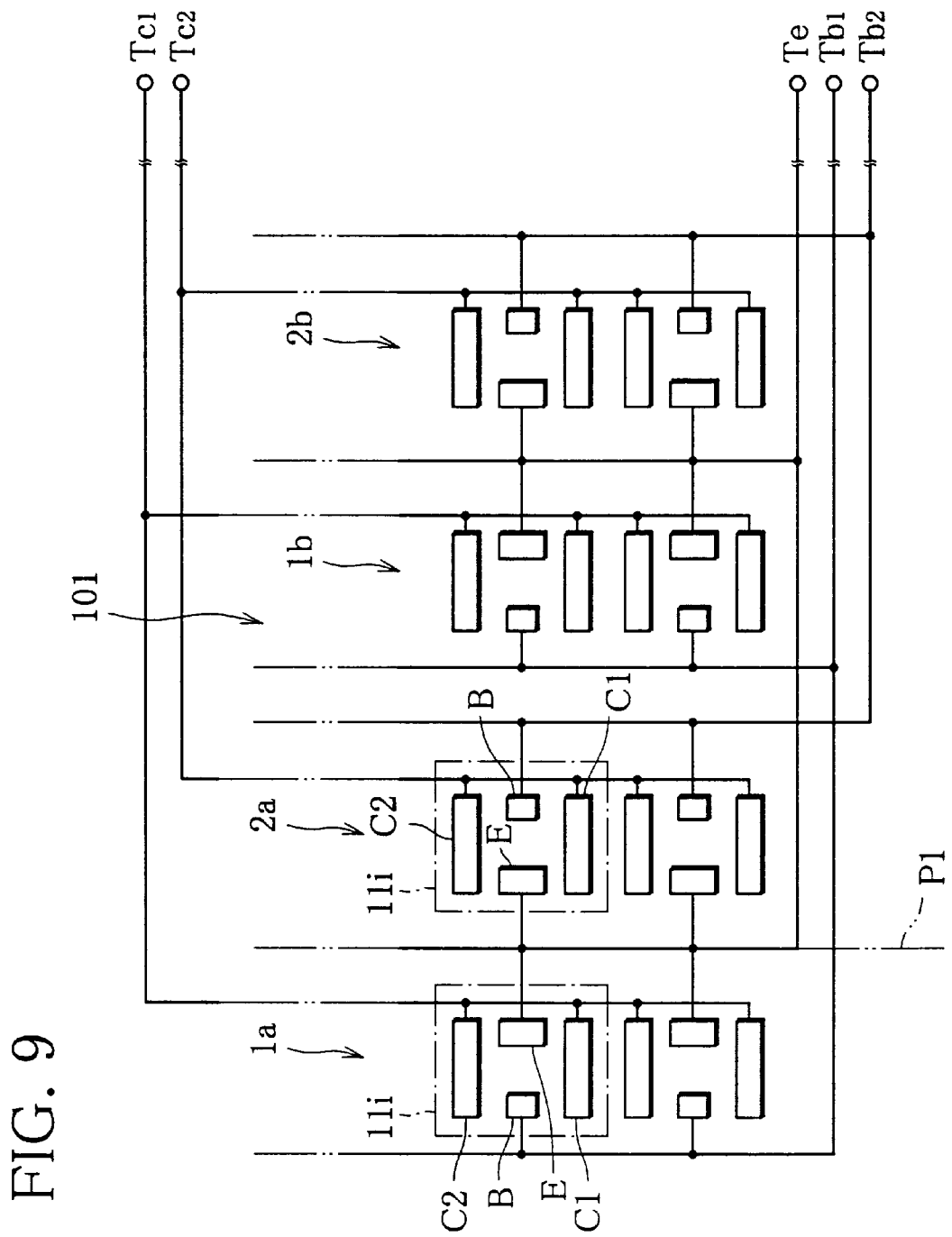
FIG. 9 is a view showing a modification of the electrode arrangement and the electrode wiring patterns shown in FIG. 6.

In the transistor cell array 101 according to a modification shown in FIG. 9, each transistor-cell pair $1a$, $2a$; $1b$, $2b$; . . . ; or $1n$ (not shown), $2n$ (not shown) have their device constructions symmetric with respect to the imaginary plane P1, and the emitter electrodes E of associated transistor elements 11$i$ are disposed to be close to one another.

Figure 8:
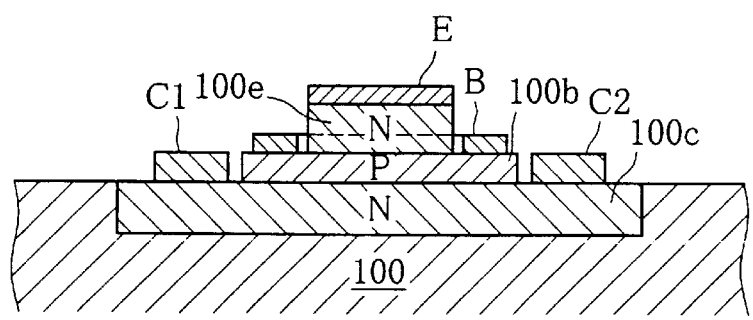
FIG. 8 is a fragmentary sectional view showing a device structure of a transistor element.

In the present embodiment, each transistor element 11 is fabricated in the form of an NPN transistor, for instance. In this case, each transistor element 11 has an N-type emitter region 10$e$, a P-type base region 10$b$, and an N-type collector region 1000$c$, as shown in FIG. 8. These three regions are formed in the above-mentioned order in the semiconductor substrate 100, as viewed from above the semiconductor substrate. As seen in the arraying direction A2 of transistor elements, the length of the base region is shorter than that of the collector region and is longer than that of the emitter region. As seen in the arraying direction A1 of transistor cells, the width of the base region is wider than that of the emitter region. Two collector electrodes C1 and C2 are formed on the top face of the collector region at locations on the both sides, as seen in the arraying direction A2 of transistor elements, of the junction between the collector and base regions. A base electrode B is formed into a U-shape on the top face of the base region so as to surround the junction between the base and emitter regions. An emitter electrode E is formed on the top face of the emitter region.

Input electrode terminals Tb1 and Tb2 for receiving a high-frequency signal are formed in the semiconductor substrate 100 at a location on one side, e.g., the lower left side in FIGS. 5 and 6, of the transistor cell array 101 as viewed in the arraying direction A1 of transistor cells. Output electrode terminals Tc1 and Tc2 for outputting a power-amplified high-frequency signal are formed in the semiconductor substrate 100 at a location on the other side, e.g., the upper right side of the transistor cell array. Further, first and second input wiring patterns Lb1, Lb2 and first and second output wiring patterns Lc1, Lc2 are formed in the semiconductor substrate 100. These input and output wiring patterns extend in the arraying direction A1 of transistor cells and are connected to the input and output electrode terminals Tb1, Tb2, Tc1 and Tc2, respectively.

Moreover, a common wiring pattern Le extending in the arraying direction A1 of transistor cells, and first, second and third electrode wiring patterns are formed in the semiconductor substrate 100. The first electrode wiring pattern is comprised of first electrode lines Lb1a, . . . , Lb1n; Lb2a, . . . , Lb2n each associated with a corresponding one of the first and second transistor cells. Each first electrode line is, on one hand, connected to the respective base electrodes B of the transistor elements forming the transistor cell corresponding to the first electrode line, and is, on the other hand, connected to a corresponding one of the first and second input wiring patterns Lb1 and Lb2. The second electrode wiring pattern is comprised of second electrode lines Lea, Leb, . . . , Len, Leo respectively connected to the common wiring pattern Le. Each second electrode line is connected to the respective emitter electrodes E of the transistor elements forming the transistor cell corresponding to the second electrode line. The third electrode wiring pattern is comprised of third electrode lines Lc1a, Lc1b, . . . , Lc1n; Lc2a, Lc2b, . . . , Lc2n each associated with a corresponding one of the first and second transistor cells. Each third electrode line is, on one hand, connected to the respective collector electrodes C1, C2 of the transistor elements forming the transistor cell corresponding to this third electrode line, and is, on the other hand, connected to a corresponding one of the first and second output wiring patterns Lc1, Lc2. The first, second, and third electrode lines extend in the arraying direction A2 of transistor elements between adjacent ones of the first and second transistor cells in the transistor cell array 101.

Repeatedly speaking, in the semiconductor device of this embodiment, corresponding ones of the first and second transistor cells are disposed adjacent to each other on the semiconductor substrate 100, to form pairs of transistor cells 1a, 2a; 1b, 2b; . . . ; 1n, 2n. These transistor-cell pairs are arrayed in the just-mentioned order in the transistor-cell arraying direction A1. The respective electrodes B, E, C1 and C2 of the first and second transistor cells are collectively connected, composite-transistor by composite-transistor, to the output wiring patterns Lc1 Lc2, the input wiring patterns Lb1 Lb2 and the common wiring pattern Le, respectively. By doing this, the first transistor cells 1a, 1b, . . . , and 1n are parallel-connected to form the first composite transistor 1, and the second transistor cells 2a, 1b, . . . , and 2n are parallel-connected to form the second composite transistor 2.

To be noted, the base electrode wiring patterns Lb1, Lb2 serving as a high-frequency signal input line and the collector electrode wiring patterns Lc1, Lc2 serving as a power-amplified high-frequency signal output line are formed along the transistor-cell arraying direction A1, thereby equalizing the direction of high-frequency signal propagation along these wiring patterns. The electrode terminals Tb1, Tb2; and Tc1, Tc2 are provided on the opposite sides of the transistor cell array 101.

As will be understood from FIG. 6 in which the arraying/ connecting patterns of the base, emitter and collector electrodes B, E, C1, C2 of transistor elements are illustrated, corresponding ones 1b, 2a; 1c (not shown), 2b; . . . ; 1n, 2m (not shown) of the first and second transistor cells, disposed adjacently to each other in the major portion of the transistor cell array, cooperate to form a transistor-cell pair having their device constructions that are mirror images of each other. In the entirety of the transistor cell array including the transistor cells 1a and 2n, the device constructions of each transistor-cell pair 1a, 2a; 1b, 2b; . . . ; or 1n, 2n are mirror images of each other.

Referring again to the major portion of the transistor cell array, each transistor-cell pair are configured to have emitter electrodes E disposed to be close to one another. These emitter electrodes E are connected to the common wiring pattern Le via the second electrode line Lea, . . . , Len, or Leo which is common to the associated two transistor cells. Ideal device constructions of the first and second transistor cells are such that the emitter electrodes of the two transistor elements, disposed adjacently to each other in the transistor cell array 101, define therebetween an electrical length which is substantially equal to zero.

As shown in FIG. 5, electrode wiring patterns Lb3, Le3 and Lc3 are formed in the semiconductor substrate 100 in relation to the third composite transistor 3 serving as a constant current source for adjusting the level of bias current for the first and second composite transistors 1 and 2. As in the conventional device shown in FIGS. 1–4, the third composite transistor 3 is comprised of parallel-connected third transistor cells 12 each of which is comprised of parallel-connected transistor elements 11. The base, emitter and collector electrodes of the transistor elements forming each of the third transistor cells are connected to the electrode wiring patterns Lb3, Le3 and Lc3, respectively. The electrode wiring pattern Lb3 is connected to an external-signal input terminal Tb3 formed in the substrate 100, the electrode wiring pattern Le3 is connected to an earth ground terminal Te formed in the substrate, and the electrode wiring pattern Lc3 is connected to the common wiring pattern Le at an emitter electrode terminal Te.

The semiconductor device of this embodiment has its basic arrangement such that a plurality of transistor cells having the same device configuration are formed on the same semiconductor substrate. Even in a power amplifier of this kind, a variation in operation characteristics of transistor cells may be caused to degrade the quality of the power-amplified high-frequency signal, due to differences in positions where the individual transistor cells are formed.

In this regard, according to the semiconductor device of this embodiment, two transistor cells, forming each transistor-cell pair 1a, 2a; 1b, 2b; . . . ; or 1n, 2n, or each transistor-cell pair 1b, 2a; . . . ; or 1n, 2m (not shown), are disposed to be close to each other on the semiconductor substrate, thereby preventing a substantial variation in operation characteristic of these two transistor cells. In addition, two transistor cells forming one transistor-cell pair are mirror images of each other, with their emitters disposed to be as close as possible, so that the emitter electrodes of each pair of two transistor elements, disposed in a facing relation, define therebetween the electrical length which is sufficiently short and that the emitter currents flowing from these transistor elements advantageously cancel out each other. Further, the mirror image arrangement makes it possible to guarantee the symmetry of high-frequency signal propagation paths of each transistor-cell pair, thereby advantageously equalizing the operation characteristics thereof.

The overall operation characteristic of the first composite transistor 1 constituted by parallel-connecting respective one transistor cells of the transistor-cell pairs having uniform characteristics is substantially equal to that of the second composite transistor 2 constituted by the other transistor cells of the transistor-cell pairs. This feature guarantees the balance characteristic of the high-frequency signal power-amplified by the composite transistors 1 and 2, to thereby satisfy the requirement on the balance characteristic that the high-frequency signal currents appearing at two output lines of the power amplifier be the same in magnitude and opposite in phase. The high-frequency signal supplied to the respective base electrodes B of each transistor-cell pair and the power-amplified high-frequency signal appearing at the collector electrodes C thereof are adequate in their balance characteristics.

With intention of carrying out stable, high-quality power amplification in the respective transistor-cell pairs, it is preferable to equalize time periods required for high-frequency signal input and output to and from the transistor-cell pairs. The required input/output time periods are closely related to time periods required for the high-frequency signal to propagate through corresponding ones of the electrode wiring patterns Lc1, Lc2, Lb1 and Lb2. In the semiconductor device of this embodiment having the electrode wiring patterns Lc1, Lc2, Lb1 and Lb2 extending along the transistor-cell arraying direction A1 and the electrode terminals Tb1, Tb2; Tc1, Tc2 provided at the opposite sides of the transistor cell array, the lengths of high-frequency signal propagation paths (corresponding to propagation time periods) extending from the base electrode terminal Tb1 or Tb2 via the respective transistor-cell pairs to the collector electrode terminal Tc1 or Tc2 are substantially the same for the respective transistor-cell pairs. In other words, the required time periods for the high-frequency signal input and output to and from the respective transistor-cell pairs are substantially the same from one another.

Figure 7:
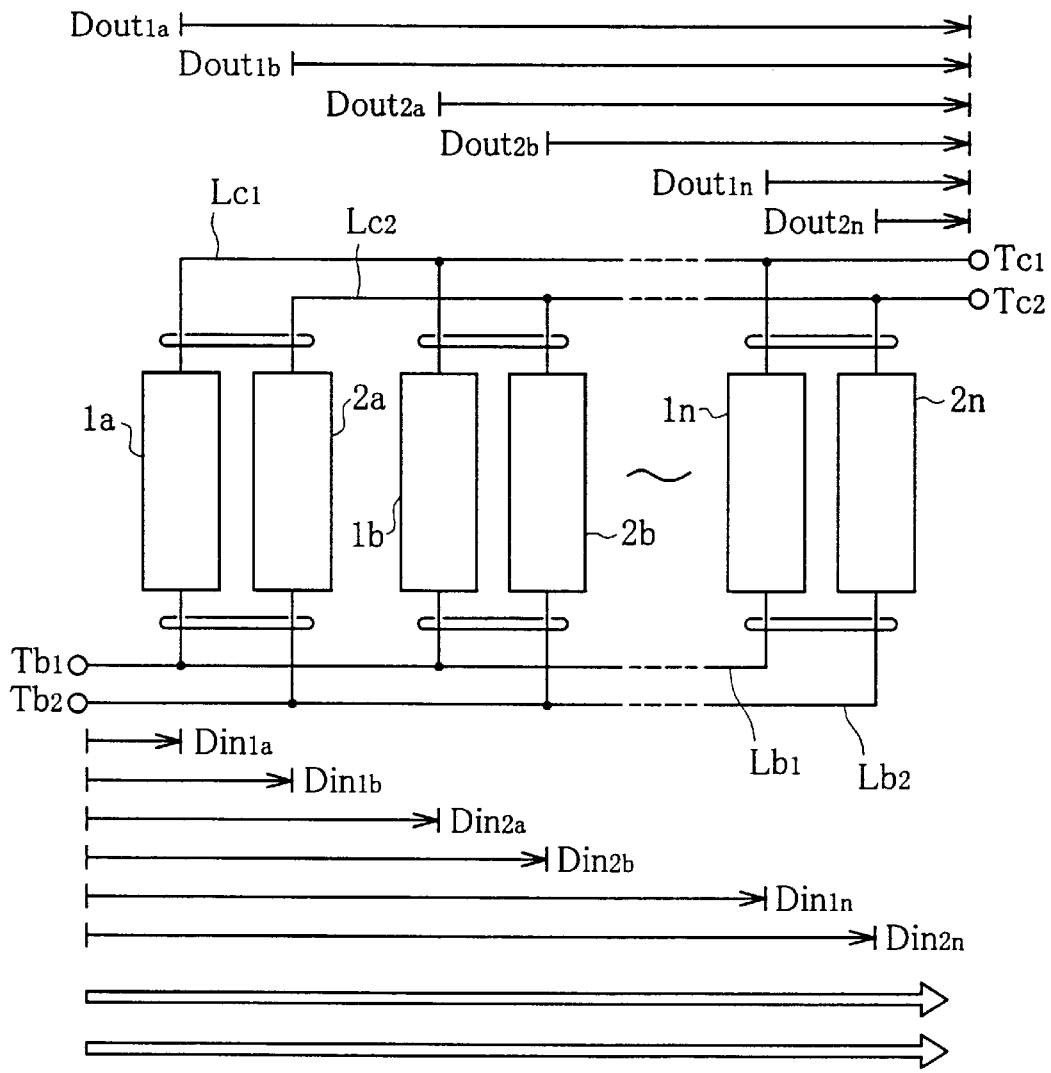
FIG. 7 is a view showing the lengths of high-frequency signal propagation paths for respective transistor cells shown in FIG. 5.

More specifically, the time period required for the propagation of the high-frequency signal from the base electrode terminals Tb1, Tb2 to the base electrodes of the transistor elements of each transistor cell, via the electrode wiring pattern Lb1 or Lb2, varies in dependence on the length Din1a, Din2a, Din1b, Din2b, . . . , Din1n or Din2n (shown in FIG. 7) of the signal propagation path on the signal-input side. Also, the time period required for the propagation of the high-frequency signal, power-amplified in each transistor cell, from the collector electrodes of the transistor elements of the transistor cell to the collector electrode terminal Tc1 or Tc2, via the electrode wiring pattern Lc1 or Lc2, varies in dependence on the length Dout1a, Dout2a, Dout1b, Dout2b, . . . , Dout1n or Dout2n (shown in FIG. 7) of the signal propagation path on the signal-output side.

Since the wiring patterns Lb1, Lb2, Lc1 and Lc2 extend in the transistor-cell arraying direction A1 and the terminals Tb1, Tb2; Tc1, Tc2 are provided on the opposite sides of the transistor cell array, the respective transistor cells have the same total length of the propagation paths on the signal input and output sides. Therefore, the required signal propagation time periods for the respective transistor cells are equalized. As a consequence, no substantial time-base deviation is caused in the output appearing at the collector electrode terminals Tc1, Tc2, even if minute time-base deviations are found in time periods required for the power amplification of the high-frequency signal in the respective transistor cells. Thus, the overall power-amplify action of the composite transistors 1, 2 is stable to achieve stable, high-quality power amplification of the high-frequency signal.

The present invention is not limited to the foregoing preferred embodiment, and various modifications thereof may be made.

For instance, a semiconductor device of this invention is not only suited to a power amplifier (corresponding to element 200 shown in FIG. 1) of the transmitter section of a portable telephone of the type described in U.S. Ser. No. 09/203,642, incorporated by reference in this application, but also applicable to other high-frequency power amplifiers.

The number of transistor cells forming each composite transistor 1 or 2 may be selected so as to conform to a required power capacity determined by, e.g., a required transmission output. The number of transistor elements of each transistor cell may be determined in accordance with a required basic technical specifications of the transistor cell. Instead of bipolar transistors, field effect transistors, high electron mobility transistors or the like may be used to configure the transistor elements.

In the embodiment, the third composite transistor 3 is employed for the adjustment of the level of bias currents applied to the first and second composite transistors 1 and 2. Alternatively, the composite transistors 1 and 2 may be grounded at their emitters, so that the composite transistors 1 and 2 may operate as a push-pull circuit.

What is claimed is:

1. A semiconductor device for high-frequency power amplification, comprising:
   a first composite transistor comprised of parallel-connected first transistor cells each comprised of parallel-connected transistor elements;
   a second composite transistor comprised of parallel-connected second transistor cells each comprised of parallel-connected transistor elements;
   first and second input wiring patterns connected to input sides of said first and second composite transistors, respectively;
   first and second output wiring patterns connected to output sides of said first and second composite transistors, respectively; and
   a semiconductor substrate formed with said first and second composite transistors, said first and second input wiring patterns, and said first and second output wiring patterns,
   wherein said first and second transistor cells are alternately arranged one another to form a transistor cell array in which adjacent ones of the first and second transistor cells are close to each other,
   said first and second input wiring patterns and said first and second output wiring patterns extend in an arranging direction of the first and second transistor cells in the transistor cell array, and
   said first and second composite transistors operate to balanced-input a high-frequency signal through said first and second input wiring patterns, effect power-amplification of the high-frequency signal, and output the power-amplified high-frequency signal from said first and second output wiring patterns.

2. The semiconductor device according to claim 1, wherein the transistor elements forming each of said first and second transistor cells are arrayed in a direction extending perpendicularly to the arranging direction of the transistor cells in the transistor cell array.

3. The semiconductor device according to claim 2, further including:
   at least first, second, and third electrode wiring patterns formed in said semiconductor substrate; and
   a common wiring pattern formed in said semiconductor substrate and extending in the arranging direction of the transistor cells in the transistor cell array,
   wherein each of said first and second transistor elements has first, second, and third electrodes formed in said semiconductor substrate and respectively connected to said first, second, and third electrode wiring patterns, and
   said first electrode wiring pattern is connected to said first and second input wiring patterns, said second electrode wiring pattern is connected to said common wiring pattern, and said third electrode wiring pattern is connected to said first and second output wiring patterns.

4. The semiconductor device according to claim 3, wherein said first electrode wiring pattern includes first electrode wires each associated with a corresponding one of said first and second transistor cells and each connected to a corresponding one of said first and second input wiring patterns, said second electrode wiring pattern includes second electrode wires connected to said common wiring pattern, and said third electrode wiring pattern includes third electrode wires each associated with a corresponding one of said first and second transistor cells and connected to a corresponding one of said first and second output wiring patterns.

5. The semiconductor device according to claim 4, wherein the transistor elements forming each of said first and second transistor cells are arrayed in a direction extending perpendicularly to the arranging direction of the transistor cells in the transistor cell array, and said first, second, and third electrode wires of these transistor elements extend between adjacent ones of the first and second transistor cells in the transistor cell array in parallel therewith.

6. The semiconductor device according to claim 1, further including:
input electrode terminals through which the high-frequency signal is input and which are formed in said semiconductor substrate at one side of the transistor cell array as viewed in the arranging direction of the transistor cells; and
output electrode terminals through which the power-amplified high-frequency signal is output and which are formed in said semiconductor substrate at another side of the transistor cell array,
wherein said first and second input wiring patterns are connected to said input electrode terminals, and said first and second output wiring patterns are connected to said output electrode terminals.

7. The semiconductor device according to claim 1, wherein said first and second transistor cells are identical in number of the transistor elements and in electrical specification thereof.

8. The semiconductor device according to claim 3, wherein the first and second transistor cells disposed adjacent to each other in the transistor cell array form a pair of transistor cells having their device structures symmetric with respect to an imaginary boundary plane extending therebetween.

9. The semiconductor device according to claim 8, wherein each pair of transistor cells are comprised of pairs of transistor elements having their device structures symmetric with respect to an imaginary boundary plane extending therebetween, and said each pair of the transistor elements have their second electrodes disposed to be close to each other.

10. The semiconductor device according to claim 9, wherein the second electrodes of the pairs of transistor elements are connected to a single common second electrode wire.

11. The semiconductor device according to claim 3, further including:
a third composite transistor formed in the semiconductor substrate; and
fourth, fifth, and sixth electrode wiring patterns formed in the semiconductor substrate,
wherein said third composite transistor is comprised of parallel-connected third transistor cells each comprised of parallel-connected transistor elements,
each of the transistor cells of said third transistor cell has at least first, second, and third electrodes respectively connected to said fourth, fifth, and sixth electrode wiring patterns.

12. The semiconductor device according to claim 11, wherein said fourth electrode wiring pattern is connected to an external signal input terminal formed in the semiconductor substrate, said fifth electrode wiring pattern is grounded, and said sixth electrode wiring pattern is connected to said common wiring pattern of said semiconductor device.

13. The semiconductor device according to claim 1, wherein said semiconductor device constitutes a power amplifier for use in a transmitter section of a portable telephone.

14. The semiconductor device according to claim 2, wherein said semiconductor device constitutes a power amplifier for use in a transmitter section of a portable telephone.

15. The semiconductor device according to claim 3, wherein said semiconductor device constitutes a power amplifier for use in a transmitter section of a portable telephone.

16. The semiconductor device according to claim 4, wherein said semiconductor device constitutes a power amplifier for use in a transmitter section of a portable telephone.

17. The semiconductor device according to claim 5, wherein said semiconductor device constitutes a power amplifier for use in a transmitter section of a portable telephone.

18. The semiconductor device according to claim 6, wherein said semiconductor device constitutes a power amplifier for use in a transmitter section of a portable telephone.

19. The semiconductor device according to claim 7, wherein said semiconductor device constitutes a power amplifier for use in a transmitter section of a portable telephone.

20. The semiconductor device according to claim 8, wherein said semiconductor device constitutes a power amplifier for use in a transmitter section of a portable telephone.

21. The semiconductor device according to claim 9, wherein said semiconductor device constitutes a power amplifier for use in a transmitter section of a portable telephone.

22. The semiconductor device according to claim 10, wherein said semiconductor device constitutes a power amplifier for use in a transmitter section of a portable telephone.

23. The semiconductor device according to claim 11, wherein said semiconductor device constitutes a power amplifier for use in a transmitter section of a portable telephone.

24. The semiconductor device according to claim 12, wherein said semiconductor device constitutes a power amplifier for use in a transmitter section of a portable telephone.

* * * * *